Dec. 8, 1964 J. OROSHNIK 3,160,534

METHOD OF MAKING TUNNEL DIODES

Filed Oct. 3, 1960

*INVENTOR.*
JESSE OROSHNIK.

*BY* R. J. Frank

ATTORNEY 3,160,534
Patented Dec. 8, 1964

3,160,534

METHOD OF MAKING TUNNEL DIODES

Jesse Oroshnik, Whitestone, N.Y., assignor to General Telephone and Electronics Laboratories, Inc., a corporation of Delaware Filed Oct. 3, 1960, Ser. No. 59,935
4 Claims. (Cl. 148—177)

This invention relates to tunnel diodes and their manufacture.

The tunnel diode is a two terminal device exhibiting a negative resistance characteristic over a portion of its operating region. In common with other semiconductor diodes, it consists of a p-type region and an n-type region. However, in the tunnel diode the concentration of impurities in both regions is much higher than that formed in conventional diodes. Also, the junction between the two regions of the tunnel diode is made quite narrow in order to increase the probability of electron tunneling.

In the manufacture of tunnel diodes by conventional techniques a metal, such as indium or gallium, is alloyed to a semiconductor base and the semiconductor material at the boundary then etched to produce a junction of suitable cross-sectional area. It is an object of my invention to present a method of manufacturing a tunnel diode which makes it unnecessary to etch the unit after alloying has been completed.

It is a further object of my invention to present a method of making a tunnel diode in which the size of the p-n junction area may be precisely and directly controlled.

Another object of the invention is to present a method of making a tunnel diode in which the junction area may be reduced to an extremely small value.

Still another object is to present a method of making a tunnel diode which is inexpensive and well suited to the mass production of these devices.

In the present invention a method of making a tunnel diode is presented which comprises the steps of depositing an electrically insulating film on the surface of a semiconductor wafer, removing a selected portion of the film thereby exposing the surface of the wafer, applying a metallic coating to the exposed surface of the semiconductor, and then alloying the metallic coating with the semiconductor material.

In a preferred embodiment of the invention, a thin quartz film is deposited onto the polished surface of a highly doped n-type germanium wafer. A layer of a photosensitive material is then placed over the quartz film and illuminated through a mask having a pattern of small opaque dots.

The wafer is next immersed in a developing solution which dissolves the photosensitive material in the areas which were shielded from the light source by the opaque dots. Thus, a pattern of precisely dimensioned spaced holes appears in the layer of photosensitive material at positions corresponding to the locations of the projected dots. The quartz film covering the germanium at the bottom of these holes is then removed. The remaining photosensitive material may be dissolved at this point since the selective and controlled removal of discrete amounts of quartz from the surface of the germanium wafer has been effected.

Next, thin coatings of gallium and indium are electroplated on the portions of the germanium wafer surface that was exposed by the holes in the film. After electroplating, the gallium-indium coating is alloyed with the germanium.

It shall be noted that a tunnel diode may also be made by this method using highly doped p-type germanium. In this case, coating of tin and arsenic may be used in place of the gallium and indium employed with the n-type semiconductor.

A layer of silver is then placed over the gallium-indium dot and an electrode having a large cross-sectional area arranged to conductively contact this layer. The electrode surrounds, but does not touch, the gallium-indium dot and therefore the mechanical stress placed on the narrow junctions is minimized. Also, the large cross-sectional area of the electrode reduces the inductance of the tunnel diode package permitting it to function at very high frequencies.

The above objects of and the brief introduction to the present invention will be more fully understood and further objects and advantages will become apparent from a study of the following description in connection with the drawings, wherein.

Figure 1:
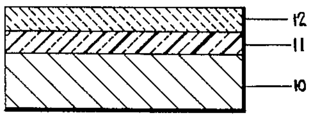
FIGS. 1–5 depict various steps in applicant's method of manufacturing tunnel diodes.

In preparing a tunnel diode by my method, a highly doped n-type germanium wafer having at least $10^{19}$ impurities per cubic centimeter and a resistivity of 0.001 ohm-cm. or less is lapped to approximately .005 to .01 inch in thickness. This low value of resistivity is required in order to assure that the probability of electron tunneling will be high. After lapping, one surface of the germanium wafer 10 is polished to a mirror finish following which all surfaces of the germanium are carefully cleaned. Next, a thin film of quartz 11 is vacuum evaporated onto the polished surface and a layer of an organic photosensitive plastic 12 placed over the quartz film as shown in FIG. 1. The photosensitive plastic may consist of any photo-polymerizable material which becomes polymerized when exposed to ultra-violet light, the solubility of the polymerized (exposed) portion being drastically reduced below the solubility of the unexposed portion. Type KPR and type KMER photosensitive plastics, manufactured by the Eastman Kodak Company, have been found suitable for this application.

Figure 2:
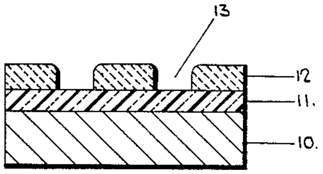
Figure 3:
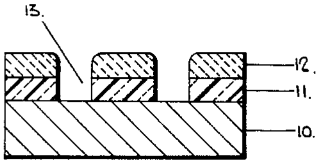

A transparency, having a pattern of black dots .005 inch in diameter or less, is prepared and an ultra-violet light source placed behind the transparency to project the pattern of dots on the photosensitive plastic 12. The wafer is then placed in a developer which dissolves the photosensitive plastic 12 only in those areas that were masked by the dots, the developer having no effect upon the quartz film 11. A developer suitable for this purpose is hot trichlorethylene vapor. Thus, as shown in FIG. 2 holes 13, having diameters approximately equal to the diameter of the dots, are produced in the photosensitive plastic layer 12. The exposed quartz film in the holes 13 is then removed (FIG. 3) by placing the wafer in a hydrofluoric acid bath. The quartz surrounding holes 13 is not removed since it is protected by the photosensitive plastic.

Figure 4:
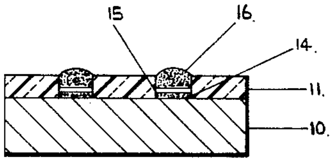

The next step is to plate gallium and indium in each of the holes 13 in the wafer. The germanium is first electroetched by placing it in a solution of indium fluoroborate and connecting it to the positive terminal of a direct voltage source for about one minute, the current density being between 5 and 25 amperes per square foot. Without removing the germanium from the indium fluoroborate bath, the polarity of the voltage source is then reversed making the germanium the cathode and thereby plating a thin lawer (about .0005 inch) of indium 14 on the germanium at the base of the hole. The wafer is then immersed in a slightly acid gallium plating bath consisting of gallium chloride and sodium acetate such that the gallium content will have a concentration of about 10 grams per liter. With the germanium acting as the cathode, a thin layer (approximately .0005 inch) of gallium 15 is plated on the indium. Finally the wafer is placed in a second indium fluoroborate solution and a layer of indium 16 plated on the gallium bringing the total thickness to about .003 to .005 inch. The photosensitive plastic is then removed by a suitable solvent, such as an ethylene chloride and dioxane mixture, the cross-section of the wafer appearing as in FIG. 4.

Figure 5:
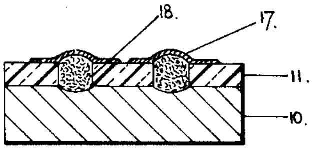

The gallium-indium button is alloyed to the germanium by heating the device rapidly to a temperature of about 500° C. and then cooling. Following the alloying operation, a disc 17 of silver .001 inch thick is vacuum evaporated over each of the alloyed gallium-indium buttons 18 as shown in FIG. 5. The germanium wafer is then divided into sections, each section having a gallium-indium button 18 at its center.

Figure 6:
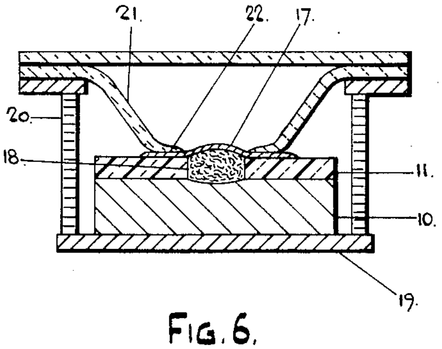
FIG. 6 is a cross-sectional schematic view of the tunnel diode package.
Figure 7:
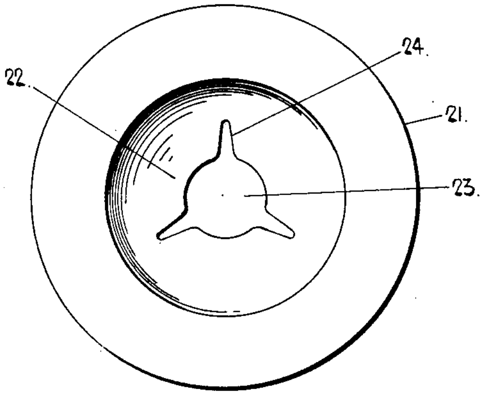
FIG. 7 is a plan view of the electrode employed in the tunnel diode package of FIG. 6.

The individual sections obtained from the wafer each comprise a tunnel diode and are mounted in a package as shown in FIG. 6. The germanium wafer 10 is brazed to a conductive Kovar plate 19 and a ceramic insulating sleeve 20 soldered to the plate 19. A disc electrode 21 made of a suitable conductive material such as Phosphor Bronze plated with nickel or silver is fastened to the ceramic members 20. As depicted in FIG. 7, disc 21 has a depressed portion 22 with an aperture 23 having radial slots 24 at the center. The depressed portion 22 of electrode 21 contacts the silver disc 17 but does not touch the indium-gallium button 18 directly. Thus, electrode 17 has a low inductance due to its large radius but does not press directly on the indium-gallium dot 18.

As many changes could be made in the above construction and many different embodiments could be made without departing from the scope thereof, it is intended that all matter contained in the above description or shown in the accompanying drawings shall be interpreted as illustrative and not in a limiting sense.

What is claimed is:

1. The method of making a tunnel diode comprising the steps of depositing a quartz film on a highly doped germanium wafer, removing a selected portion of said film to expose the surface of said germanium wafer, plating a first coating of indium on the exposed portion of said germanium wafer, plating a coating of gallium on said first coating of indium, plating a second coating of indium on said coating of gallium, and alloying said first and second coatings of indium and said coating of gallium with said germanium wafer.

2. The method of making a tunnel diode comprising the steps of vacuum evaporating a quartz film on the surface of a highly doped germanium wafer, applying a photosensitive layer to said quartz film, illuminating selected discrete portions of said photosensitive layer, removing the portions of said photosensitive layer not receiving said illumination, removing the quartz film exposed by the removal of said selected portions of the photosensitive layer, plating successively coatings of indium, gallium and indium on the portion of the surface of said germanium wafer exposed by the removal of said quartz film, and alloying said indium-gallium-indium coatings with said germanium.

3. The method of making a tunnel diode comprising the steps of depositing an electrically insulating film on the surface of a semiconductor wafer, removing a selected portion of said film to expose the surface of said semiconductor wafer, plating a first coating of indium on the exposed portion of said semiconductor wafer, plating a coating of gallium on said first coating of indium, plating a second coating of indium on said coating of gallium, and alloying said first and second coatings of indium and said coating of gallium with said semiconductor wafer.

4. The method of making a tunnel diode comprising the steps of depositing a quartz film on one surface of a germanium wafer, applying a photosensitive layer to said quartz film, illuminating selected portions of said photosensitive layer, removing the portions of said photosensitive layer not receiving said illumination, removing the quartz film exposed by the removal of said selected portions of the photosensitive layer, applying a first coating of indium to the exposed portion of said germanium wafer by plating in a first solution of indium fluoroborate, applying a coating of gallium to said first coating of indium by plating in a solution consisting of gallium chloride and sodium acetate, applying a second coating of indium to said coating of gallium by plating in a second solution of indium fluoroborate, removing the remainder of said photosensitive layer, and alloying said first and second coatings of indium and said coating of gallium with said germanium wafer.

References Cited in the file of this patent

UNITED STATES PATENTS

| | | |
|---|---|---|
| 2,829,422 | Fuller | Apr. 8, 1958 |
| 2,842,831 | Pfann | July 15, 1958 |
| 2,931,958 | Arthur et al. | Apr. 5, 1960 |
| 2,937,324 | Kroko | May 17, 1960 |
| 2,972,092 | Nelson | Feb. 14, 1961 |
| 2,981,877 | Noyce | Apr. 25, 1961 |
| 2,994,121 | Shockley | Aug. 1, 1961 |